(12) United States Patent
Volk

(10) Patent No.: US 6,624,662 B1
(45) Date of Patent: Sep. 23, 2003

(54) BUFFER WITH COMPENSATING DRIVE STRENGTH

(75) Inventor: Andrew M. Volk, Granite Bay, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/608,503

(22) Filed: Jun. 30, 2000

(51) Int. Cl.[7] .................. H03K 19/094; H03K 17/16
(52) U.S. Cl. .................................... 326/87; 326/27
(58) Field of Search ............................ 326/30, 87, 86, 326/83, 26, 27

(56) References Cited

U.S. PATENT DOCUMENTS

| | | | |
|---|---|---|---|
| 4,768,170 A | | 8/1988 | Hoff |
| 4,975,598 A | | 12/1990 | Borkar |
| 5,194,765 A | * | 3/1993 | Dunlope et al. ............. 326/87 |
| 5,341,045 A | | 8/1994 | Almulla |
| 5,463,520 A | | 10/1995 | Nelson |
| 5,514,951 A | | 5/1996 | Halim et al. |
| 5,528,166 A | | 6/1996 | Iikbahar |
| 5,534,801 A | | 7/1996 | Wu et al. |
| 5,578,971 A | | 11/1996 | Minami et al. |
| 5,596,285 A | | 1/1997 | Marbot et al. |
| 5,666,078 A | * | 9/1997 | Lamphier et al. ........... 327/108 |
| 5,798,971 A | | 8/1998 | Larsen et al. |
| 5,898,321 A | | 4/1999 | Ilkbahar et al. |
| 5,930,271 A | | 7/1999 | Takahashi |
| 6,023,174 A | | 2/2000 | Kirsch |
| 6,040,714 A | | 3/2000 | Klein |
| 6,040,845 A | | 3/2000 | Melo et al. |
| 6,052,325 A | | 4/2000 | Merritt |
| 6,054,881 A | | 4/2000 | Steonner |
| 6,072,351 A | | 6/2000 | Sharpe-Geisler |
| 6,114,895 A | * | 9/2000 | Stephens .................. 327/391 |
| 6,141,258 A | * | 10/2000 | Kawasumi ............. 365/189.05 |
| 6,166,563 A | | 12/2000 | Volk et al. |
| 6,272,644 B1 | | 8/2001 | Urade et al. |
| 6,308,289 B1 | | 10/2001 | Ahrens et al. |
| 6,326,821 B1 | * | 12/2001 | Gabara ..................... 327/112 |

FOREIGN PATENT DOCUMENTS

| | | |
|---|---|---|
| EP | 0611053 A | 8/1994 |
| EP | 0752677 A | 8/1994 |
| WO | WO 98/31017 | 7/1998 |

OTHER PUBLICATIONS

Thaddeus J. Gabara and Scott C. Knauer, "Digital Adjustable Resistors in CMOS for High–Performance Applications", IEEE Journal of Solid State Circuits, vol. 27, No. 8, pp. 1176–1185 (Aug. 1992).

Andre DeHon, Thomas Knight, Jr., and Thomas Simon, "Automatic Impedance Control", Proceeding of the 1993 IEEE International Solid–State Circuits Conference, pp. 164–165 (1993).

J.D. Trotter, S. Rekhi, V. Chava, and P.C. Kale, "A CMOS Low Voltage High Performance Interface", Proceedings of the 7th IEEE International ASIC Conference and Exhibit, pp. 44–48 (Apr. 1994).

Toshiro Takahashi, Makio Uchida, Takahiko Takahashi, Ryozo Yoshino, Masakazu Yamamoto, and Nobuaki Kitamura, A CMOS Gate Array with 600Mb/s Simultenous Bidirectional I/O Circuits, Proceedings of ICCSC '95, vol. 30, No. 12, pp. 1544–1546 (1995).

(List continued on next page.)

*Primary Examiner*—Michael Tokar
*Assistant Examiner*—James H. Cho
(74) *Attorney, Agent, or Firm*—Blakely, Sokoloff, Taylor & Zafman LLP

(57) ABSTRACT

A compensating buffer providing both course tuning on initialization and fine-tuning during operation is disclosed. The course tuning is provided by a plurality of binary-weighted driver legs which are selected during initialization. The fine-tuning which is selectable during both initialization and during operation is provided through linear-weighted biasing. The linear-weighted biasing is simplified through the use of a digital-to-analog converter.

24 Claims, 4 Drawing Sheets

OTHER PUBLICATIONS

Harold Pilo, Steve Lamphier, Fred Towler, and Richard Hee, "A 300Mhz, 3.3V 1 Mb SRAM Fabricated in a 0.5um CMOS Process", Proceedings of the 1996 IEEE International Solid–State Circuits Conference, pp. 148–149 (1996).

Thomas F. Knight, Jr. and Alexander Krymm, "A Self–Terminating Low–Voltage Swing CMOS Output Driver", IEEE Journal of Solid–State Circuits, vol. 23, No. 2, pp. 457–464 (Apr. 1988).

Paul R. Gray and Robert G. Meyer, "Analysis and Design of Analog Integrated Circuits", 3rd Edition, John Wiley & Sons, pp. 201–204 (1993).

PCT Notification of Transmittal of The International Search Report or The Declaration for PCT Counterpart Application No. PCT/US01/19326 Containing International Search Report (Nov. 11, 2001).

* cited by examiner

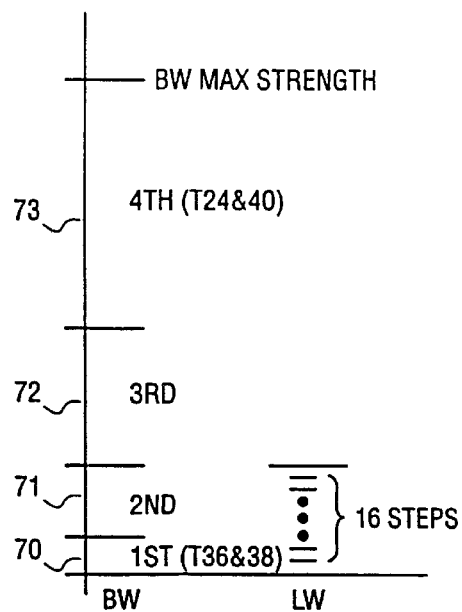 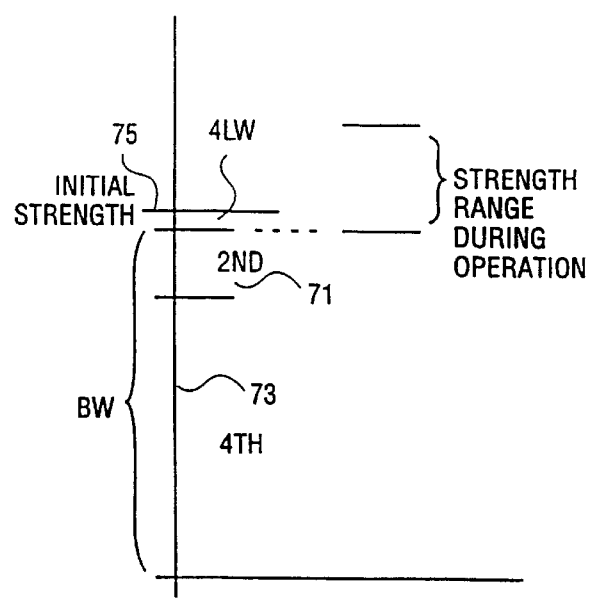
FIG. 3A                    FIG. 3B

BUFFER WITH COMPENSATING DRIVE STRENGTH

FIELD OF THE INVENTION

The invention relates to the field of compensating buffers for integrated circuits.

RELATED ART

As the complexity of personal computers and other systems employing integrated circuits increases, the need for precise output drivers has become more critical. Often an integrated circuit is required to drive signals with frequencies of 100 MHz or higher over printed circuit board traces several inches in length. Such traces behave as transmission lines making the data transfer difficult unless the impedance of the buffers compensates for the transmission line characteristics. Other factors enter into the need for compensated buffers, for instance, temperature and voltage vary during circuit operation which changes the characteristics of the buffers.

Numerous compensating output buffers are known such as shown in U.S. Pat. Nos. 5,578,971; 5,528,166; 4,975,598 and 4,768,170.

In co-pending application U.S. Ser. No. 09/299,771; filed Apr. 26, 1999, entitled "Method and Apparatus for Dual Mode Output Buffer Impedance Compensation," now U.S. Pat. No. 6,166,563 (assigned to the assignee of the present application) a buffer disclosed with binary-weighted compensating driver legs which are selected during reset or initialization. External pull-up and pull-down resistors are used to allow a determination of which driver legs are needed. The present invention builds upon the buffer described in the above application as will be seen.

BRIEF DESCRIPTION OF THE DRAWINGS

FIG. 3A is a diagram used to illustrate the relative strength between the binary-weighted (BW) driver legs and the strength provided by the linear-weighted (LW) biasing signal.

FIG. 3B is a diagram used to illustrate a typical BW initial strength and the additional strength provided by the LW biasing signal.

DETAILED DESCRIPTION OF THE PRESENT INVENTION

A compensating buffer for an integrated circuit is disclosed. In the following description numerous specific details are set forth such as specific numbers of legs in the buffer, in order to provide a thorough understanding of the present invention. It will be apparent to one skilled in the art that the present invention may be practiced without these specific details. In other instances, well-known circuits such as digital-to-analog converters (DAC) are not set forth in detail in order not to unnecessarily obscure the present invention.

Figure 1:
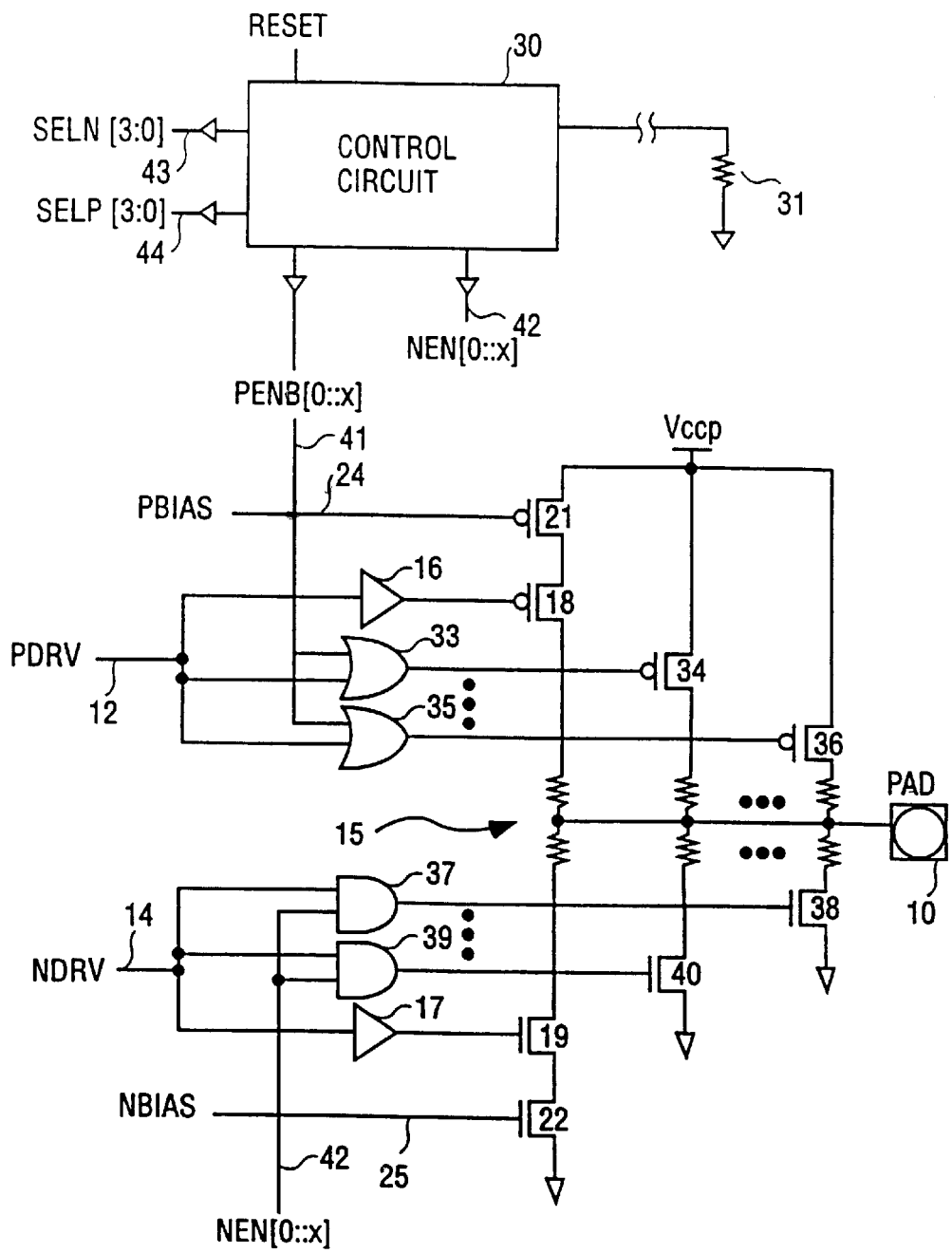
FIG. 1 is an electrical schematic of the invented buffer and a control circuit used to control the operation of the buffer.

Referring first to FIG. 1, the buffer legs shown includes a plurality of binary-weighted (BW) output driver legs used for compensation. These driver legs provide course tuning of the output signal strength. For instance, the pull-up transistor 34 and the pull-down transistor 40 provide the greatest strength (e.g., 8×) while transistors 36 and 38 provide the least strength (e.g., 1×). In a typical embodiment, four BW legs may be used with their relative strengths shown in FIG. 3A. Note that for the fourth leg shown in FIG. 3A, transistor 34 or 40 provides the strength 73, whereas for the first leg transistor 36 or 38 provides the strength 70. The difference in strength may be provided by the selection of either the size of the transistors or the values of the resistors used in these legs or a combination of transistor size and resistor values. It is known to use these resistors to make the V-I characteristics of the buffer more linear. This has signal quality benefits particularly at high data rates. Also as known, a composite set of transistors that have linear characteristics can be used. Thus, each pull-up and pull-down transistor may compromise one or more transistors. (The composite set of transistors as well as use of the resistors may be used in the LW voltage controlled legs discussed below.)

As taught in the above-mentioned patent application, a number of the BW legs are selected upon initialization of the integrated circuit to provide the desired strength. A control circuit 30, described in detail in the above-mentioned application, uses two counters to provide binary signals indicating the needed pull-up and pull-down strengths. The signals (PENB) on lines 41, consisting for one embodiment of four bits, selects the needed number of pull-up transistors. Four bits on lines 42 provide the signal (NEN) used to select the needed pull-down transistors.

Each line 41 is connected to an OR gate, such as OR gates 33 and 35. The other terminals of the OR gates receive the P driving signal (PDRV). The outputs of the OR gates are coupled to the pull-up transistors; specifically, the output of gate 33 is connected to the gate of the p-channel transistor 34 and the output of the gate 35 is connected to the gate of the p-channel transistor 36. It will be appreciated that while OR gates are used, other logic may be used to drive the pull-up transistors.

Similarly, each of the lines 42 are connected to an AND gate such as AND gates 37 and 39. The other terminals of the AND gates receive the N driving signal from line 14 (NDRV). The output of the AND gates are connected to the n-channel transistors in the BW driver legs; specifically, the output of AND gate 37 is connected to the gate of transistor 38 and the output of the AND gate 39 is connected to the gate of transistor 40. Again it will be appreciated that other logic may be used to claim the pull-down transistors.

Upon initialization or reset of the integrated circuit, control circuit 30 provides the binary signals representing the needed strength. These signals select the appropriate output drivers. Circuit 30 uses one or more external resistors such as resistor 31 and a reference potential, to evaluate the output strength as described in the above-mentioned application.

The BW output driver legs provide a relatively course tuning of the output strength. Even the driver with the least significant strength, provides a relatively large adjustment in the output strength of the buffer. Consequently, reselecting BW legs during operation of the buffer can cause errors in signal detection. Generally, termination devices do not know when the input signal is transitioning and thus do not know when it is safe to upgrade the strength. As described below, the present invention provides fine-tuning which can occur during buffer operation.

The buffer of FIG. 1 includes an anchor leg 15 to provide a certain level of output signal when no compensation is used and to provide the fine-tuning. This leg provides an output signal to the pad 10 even when none of the BW legs are selected and when the LW biasing signals are "off." Thus, the pull-up transistor 18 and the pull-down transistor 19 always provide some output signal when the buffer is output enabled. These transistors receive the P drive and N drive signal through the inverters 16 and 17, respectively. The anchor leg 15 additionally includes a p-channel transistor 21 and an n-channel transistor 22. These transistors receive biasing signals on lines 24 and 25, respectively, which provide fine-tuning of the output signal. When the buffer is in the receiving mode (PDRV high and NDRV low) no drive exists from the anchor by 15 and the buffer has a high input impedance.

During operation of the buffer, first the appropriate number of BW legs are selected, any combination of pull-up or pull-down transistors may be selected. Then, the strength of the output signal is periodically monitored to determined if it needs to be additionally compensated. For instance, every few milliseconds after initialization, the control circuit 30 using the same mechanism used to provide the PENB and NEN signals, provides similar binary signals on lines 43 and 44. The same pull-up counter and pull-down counter used to provide the signals on lines 41 and 42 may again be used to provide the signals on lines 43 and 44. These counters and their operation are described in detail in the above-mentioned application. In one embodiment, lines 43 and 44 each provide four bits shown as the SELN signals (lines 43) and the SELP signals (lines 44).

The SELN and SELP signals can each control separate transistors for the fine-tuning. However, this would be a somewhat costly implementation since separate drivers are needed for each of the transistors. Rather, in the embodiment described in FIG. 2, a pass gate digital-to-analog converter (DAC) is used.

Figure 2:
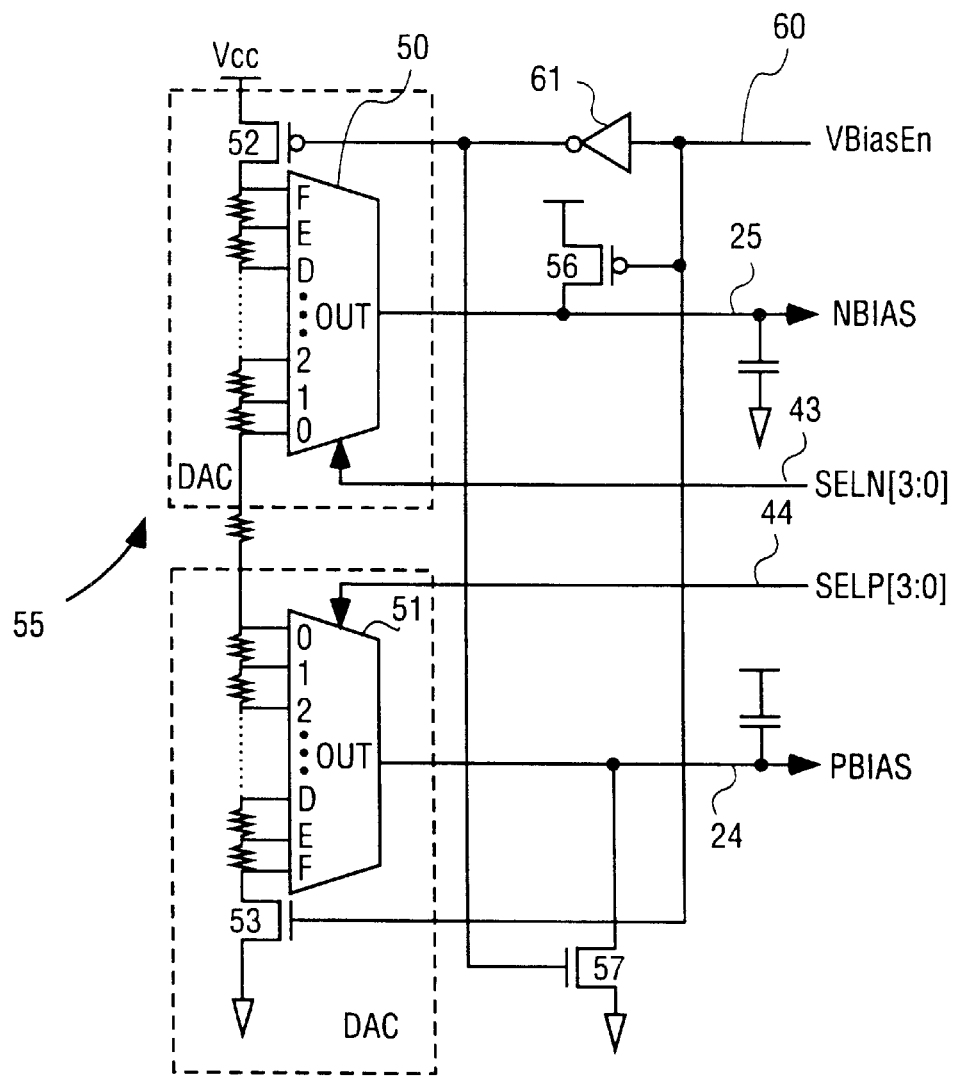
FIG. 2 is an electrical schematic of a digital-to-analog converter (DAC) used to provide biasing signals for control of the anchor leg of the buffer of FIG. 1.

Referring now to FIG. 2, each DAC is implemented with a plurality of resistors in leg 55 and a multiplexer. Leg 55 is coupled between the transistors 52 and 53 and includes a first plurality of series resistors coupled to the MUX 50 and a second plurality of series resistors coupled to MUX 51. There are 16 resistors in one embodiment coupled to the MUX 50 and 16 resistors coupled to the MUX 51. The transistors 52 and 53 are enabled by the VBiasEn signal on line 60 which is coupled to transistor 53 and to transistor 52 through the inverter 61. The signal on line 60 also allows line 25 to be decoupled from the power supply potential by turning-off pull-up transistor 56 and line 24 to be released from ground by turning off transistor 57 since the gate of transistor 57 is coupled to inverter 61. The top of the power supply range is used for NBIAS and the bottom for PBIAS so that uniform individual steps in voltage produce approximate uniform steps in strength of transistors 21 and 22 of FIG. 1. An advantage of using voltage closest to the full power supply potential is that more immunity to noise occurs that may otherwise cause variations in buffer strength.

The binary signals on lines 43 cause the MUX 50 to select the potential on one of the 16 resistors for coupling to line 25 through passgate transistors in the MUX 50. Consequently, the potential on line 25 takes on one of 16 steps beginning with the highest potential on terminal F and the lowest on terminal 0. Similarly, the MUX 51 selects one of 16 potentials in leg 55 by coupling one of the 16 terminals 0 through F to line 24. Again this is done through passgate transistors in MUX 51. In this way, the signals on lines 24 and 25 are in effect "analog" in that each assumes one of 16 values where the difference between each step is equal. By way of example, each of the equal steps may be between 20 and 50 mV.

The function of resistors and DACs of FIG. 2 can be realized in other ways. For instance, two separate, overlapping resistor strings could be used or a single resistor string can be used with overlapping taps.

Referring again to FIG. 1, the PBIAS potential on line 24 is coupled to the p-channel transistor 21. This biasing potential determines the pull-up strength in the anchor leg 15. Each step in the PBIAS signal provides a relatively small change in output strength when compared to even the least significant of the BW drivers as will be described in more detail below. Similarly the signal on line 25, the NBIAS signal, has 16 equal steps and determines the bias for the pull-down transistor 22. Each of these steps provides relatively small signal strength changes at the output pad 10 when compared to the smallest of the BW pull-down drivers.

The SELN and SELP signals from the control circuit 10 during operation of the integrated circuit, periodically prescribes updated output strengths. These signals adjust the biasing on transistors 22 and 21, respectively, through the DACs of FIG. 2. In this way the signal strength on pad 10 is finely tuned during operation of the integrated circuit.

Referring to FIG. 3A, the relative strengths provided by the binary-weighted (BW) driver legs and the linear-weighted (LW) biasing signals are shown. On the left of FIG. 3A, four strengths are shown, each provided by a different BW leg. FIGS. 3A and 3B represent either the pull-up or pull-down strengths. It should be noted that a different combination of pull-up and pull-down transistors may be selected by the PENB and NEN signals. Similarly, a different step may be selected by each of the SELN and SELP signals.

The BW strength provided by the least significant of the BW legs is shown as strength 70 in FIG. 3A. As mentioned, this may be provided by either the transistors 36 or 38. The next most significant strength is shown as strength 71 and the third most significant strength as strength 72. The most significant of the strengths is shown by strength 73 and may be provided, for instance, by either transistor 34 or 40. There are 16 steps for the fine-tuning. Thus, for this embodiment, the BW strength range is $(2^n k-1)$ where n=4 and k is a constant and the LW strength range is approximately 4 k. In general, if there are p bits in the LW range, and the ratio of a least significant bit of BW to LW is "n" the LW strength range is $(2^p k/n-1)$.

In operation upon initialization or reset, a combination of the BW legs are selected to provide the desired strength. The strength of the BW legs that equals or falls closest to but less than the desired strength level is selected. In FIG. 3B, assume upon initialization that the BW strengths 71 and 73 most closely provide the initial output strength 75. Note that for the example of FIG. 3B, if strength 70 were also selected, the BW legs would provide more than the required initial strength 75. This is undesirable since then there is no room for fine-tuning. On initialization, the difference in strength provided by the BW legs and what is actually required is made up by the LW biasing.

In one embodiment, on initialization the LW biasing is limited to selections ranging from steps 4 to 7. That is, initially the control circuit 10 may only vary the two least significant bits of the SELN and the SELP signals. In FIG. 3B the fine-tuning selects four LW steps to make up the difference between strengths 71 and 73, thereby achieving the desired initial strength 75.

During operation the control circuit 30 periodically adjusts the SELN and the SELP signals. During each of the periodic adjustments the control circuit allows at most, only a one step change in either or both the SELN and SELP signals. These relatively small changes in strength prevent misdetections of signals and allow the strength to be changed at any time. Even these small changes can be smoothed out to prevent step changes. The capacitors on lines 24 and 25 of FIG. 2 provide such smoothing. Other filtering can be used to smooth out the step changes.

As can be seen from FIG. 3B, during operation the initial strength can be lowered by four LW steps and can be raised by as much as 12 LW steps in one embodiment. One may choose to use only the least significant bit during initialization and thus have a wide range of LW steps during operation. Generally during operation the temperature increases and the power supply voltage decreases requiring additional strength, consequently more room is provided for increasing the strength than decreasing it. Also, it should be noted from FIG. 3A that the 16 steps provide approximately the range associated with the two least significant BW bits. This allows adequate range for the LW signals both for initialization and during operation.

Figure 4:
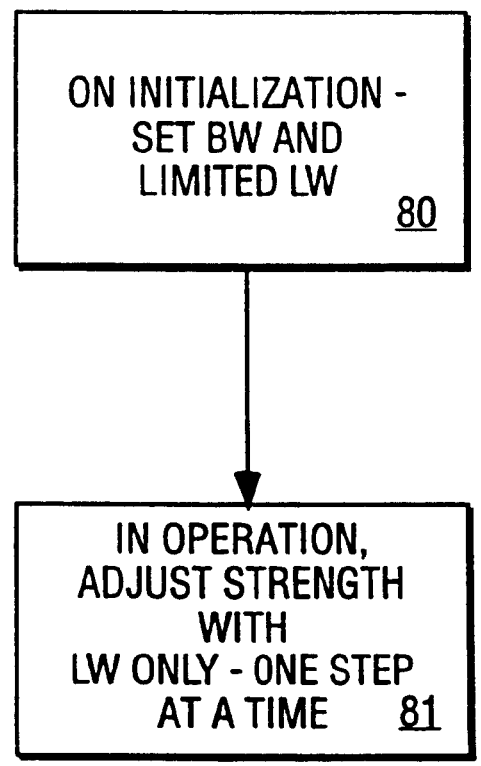
FIG. 4 shows the method used in the operation of the buffer of the present invention.

In FIG. 4, the steps used for controlling the buffer is illustrated. On initialization as shown by step 80, BW legs are selected and some limited range (e.g., 4 to 7) of the LW biasing signal is used. During operation, only the LW signal is changed and then such changes occur only one step per period as shown by step 81.

The invented buffer is particularly useful for point-to-point transfers for graphics cards, I/O devices, and may be used in other circuits such as processors. The invented buffer allows the buffer strength to be updated while the buffer is in use as either a driver or a terminator. The LW steps, since they are relatively small, guarantee that the strength cannot change dramatically and cause signal misdetections. Through use of the DACs the circuit is relatively simple when compared to implementing transistors to provide fine-tuning.

What is claimed is:

1. A buffer for an integrated circuit comprising:
   a first plurality of selectable devices to provide an output signal, wherein the output signal has a first strength range determined by the selectable devices that are selected;
   a driver circuit comprising a transistor coupled to the first plurality of selectable devices to provide adjustable strength to the output signal over a second strength range, wherein the second range is less than the first range, wherein the transistor is biased by a signal having one of at least three values; and
   a control circuit coupled to the first plurality of selectable devices and the driver circuit, wherein the control circuit selects the selectable devices upon initialization of the integrated circuit, wherein the control circuit periodically monitors the output signal strength and adjusts the driver circuit if the output signal needs to be compensated.

2. The buffer defined by claim 1 wherein the selectable devices are binary-weighted.

3. The buffer defined by claim 2 wherein the selected device comprises transistors and resistors.

4. The buffer defined by claim 3 wherein the control circuit provides the adjustment for the driver circuit by providing at least one biasing signal.

5. The buffer defined by claim 4 wherein the control circuit provides two biasing signals, one for at least one p-channel transistor and the other for at least one n-channel transistor.

6. The buffer defined by claim 1 wherein the control circuit provides a biasing signal for adjusting the driver circuit comprising a first signal applied to the gate of at least one n-channel transistor and a second signal applied to the gate of at least one p-channel transistor.

7. The buffer defined by claim 1 wherein the control circuit includes a digital-to-analog converter, an output of which provides a biasing signal for adjusting the driver circuit.

8. The buffer defined by claim 7 wherein the biasing signal is filtered to smooth the biasing signal.

9. The buffer defined by claim 8 wherein the digital-to-analog receives a binary signal to compensate for operating changes in output signal.

10. The buffer defined by claim 1 wherein a maximum first strength range is equal to $(2^n k-1)$ and wherein the second range is equal to at least approximately 4 k, where k is a constant and n is the number of selectable pull-down devices in the first plurality of selectable devices.

11. The buffer defined by claim 1 wherein the control circuit upon initialization permits a predetermined portion of the second range provided by the driver circuit to be selected.

12. The buffer defined by claim 11 wherein the second range comprises a plurality of steps and wherein the control circuit limits the number of the steps that may be changed at any one time during operation of the integrated circuit.

13. The buffer defined by claim 12 wherein the second range comprises 16 steps with only one step change being permitted at any one time during operation of the integrated circuit.

14. A buffer for an integrated circuit comprising:
   a plurality of driver devices some of which are selected upon initialization of the integrated circuit;
   a driver circuit providing a driving signal for periodically fine-tuning an output strength of the buffer during operation in increments substantially smaller than increments provided by the driver device; and
   a control circuit in communication with the driver devices and the driver circuit, wherein the control circuit monitors the output strength of the buffer and controls the driver circuit in response to changes in output strength.

15. The buffer defined by claim 14 wherein a first range of strength provided by the driver circuit is substantially less than a second strength range provided by the driver devices.

16. The buffer defined by claim 15 wherein the range of the increments that are selectable on initialization are limited.

17. A method for controlling a buffer in an integrated circuit comprising:
   selecting output devices to provide a predetermined output strength upon initialization; and
   fine-tuning the output strength using a generated analog signal during operation of the buffer with changes to the output strength limited to relatively small changes when compared to strength increments provided by the output devices.

18. The method defined by claim 17 wherein a limited amount of the fine-tuning occurs upon initialization.

19. The method defined by claim 18 wherein the fine-tuning occurs periodically during the operation of the buffer.

20. The method defined by claim 17 wherein the selecting of output devices comprises the selecting of binary-weighted output devices.

21. The method defined by claim 20 wherein the fine-tuning comprises the selection of linear steps.

22. A method of controlling the output strength of a buffer comprising the steps of:

provinding a course tuning for the output strength;

providing a periodic fine-tuning for the output strength, wherein the fine-tuning is controlled by an analog biasing signal; and limiting the fine-tuning that is selectable on initialization to less than full range of the fine-tuning.

23. The method of claim 22 wherein analog signal is generated by a digital-to-analog converter.

24. The method of claim 22, further comprising the step of monitoring the output strength of the buffer.

* * * * *